United States Patent [19]
Tanaka et al.

[11] Patent Number: 4,575,824
[45] Date of Patent: Mar. 11, 1986

[54] METHOD FOR CONTROLLING READ-OUT OR WRITE IN OF SEMICONDUCTOR MEMORY DEVICE AND APPARATUS FOR THE SAME

[75] Inventors: Miki Tanaka, Kawasaki; Kazuo Ooami, Yokohama, both of Japan

[73] Assignee: Fujitsu Limited, Kawasaki, Japan

[21] Appl. No.: 453,116

[22] Filed: Dec. 27, 1982

[30] Foreign Application Priority Data

Dec. 29, 1981 [JP] Japan .................. 56-214816

[51] Int. Cl.⁴ ................................................ G11C 7/00
[52] U.S. Cl. ..................................... 365/189; 365/233; 365/201
[58] Field of Search ............... 365/189, 179, 230, 233, 365/191, 201; 371/21

[56] References Cited

U.S. PATENT DOCUMENTS 4,086,662  4/1978  Itoh ................................ 365/189
4,240,139  12/1980  Fukuda et al. ..................... 364/200
4,405,996  9/1983  Stewart ........................ 365/189 X

FOREIGN PATENT DOCUMENTS 2803989  8/1978  Fed. Rep. of Germany .
2853926  6/1979  Fed. Rep. of Germany .
2807616  8/1979  Fed. Rep. of Germany .
2855744  7/1980  Fed. Rep. of Germany .
2942741  5/1981  Fed. Rep. of Germany .

Primary Examiner—Joseph A. Popek
Attorney, Agent, or Firm—Staas & Halsey

[57] ABSTRACT

A method for controlling the readout or write-in of a semiconductor memory device, and an apparatus for the same. During the selection of memory cells in a memory cell array to readout or write in data, the steps of selecting the memory cells of a specific address in the memory cell array include accessing the memory cells of the specific address and then and only then accessing the memory cells of the designated address corresponding to address signals input from the outside.

4 Claims, 7 Drawing Figures

Fig. 5
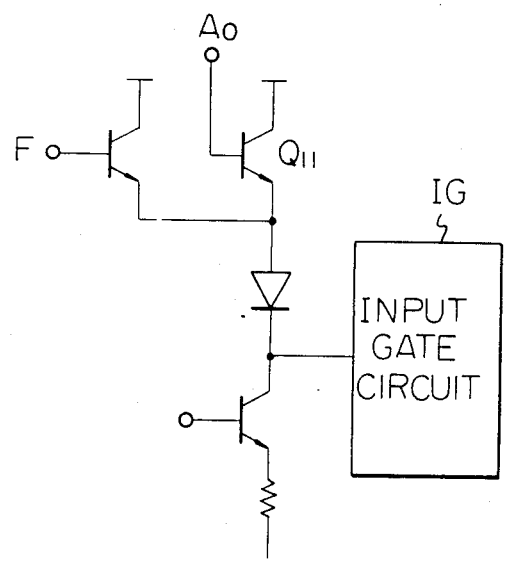
Fig. 6A
PRIOR ART
Fig. 6B
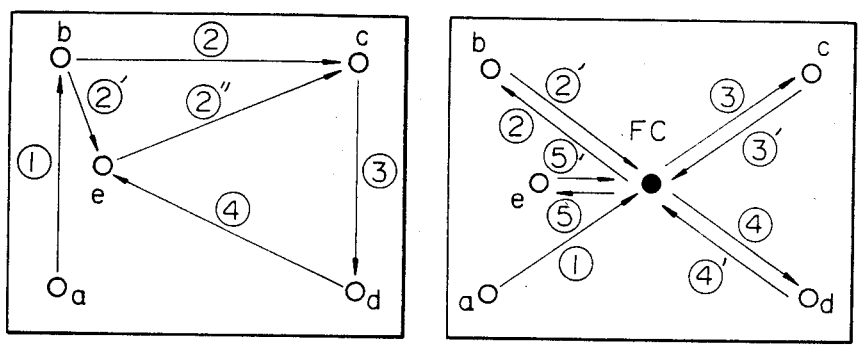

METHOD FOR CONTROLLING READ-OUT OR WRITE IN OF SEMICONDUCTOR MEMORY DEVICE AND APPARATUS FOR THE SAME

BACKGROUND OF THE INVENTION (1) Field of the Invention

The present invention relates to a method for controlling readout or write-in of a semiconductor memory device and an apparatus for the same.

(2) Description of the Prior Art

The characteristics, for example, working velocity, of a semiconductor memory device, especially a random access memory (RAM), depend on the selection pattern since the memory cells are selected at random in such a device.

Therefore, during a pre-shipment test, various selection patterns are used for testing, the characteristics of a RAM. Each cell of the memory cell array is directly selected by a corresponding address command. For example, if a plurality of cells a, b, c d and e are to be selected, the selection pattern may be "a→b→c→d→e", "a→b→e→c→d→e", etc. Such differences in the patterns by which the memory cells are selected result in different characteristics of the semiconductor memory device.

In the prior art, compliance with the required working characteristics of all the selection patterns has to be confirmed by testing all the selection patterns, thus requiring an extremely long testing time.

SUMMARY OF THE INVENTION

An object of the present invention is to provide a method by which the dependence of the working characteristics of a semiconductor memory device on the selection patterns of the memory cells is reduced and in which the testing of the semiconductor memory device is facilitated.

Another object of the present invention is to provide an apparatus for the same.

The above-mentioned first object can be achieved by a method for controlling the readout or write-in of a semiconductor memory device including, during the selection of memory cells in the memory cell array to readout or write in data, the steps of selecting the memory cells of a specific address in the memory cell array, accessing the memory cells of the specific address, and then and only then accessing the memory cells of the designated address corresponding to address signals input from the outside.

The above-mentioned second object of the present invention can be obtained by an apparatus for controlling the readout or write-in of a semiconductor memory device, wherein an address latch portion, an address decoder portion, a memory cell array portion, and an output latch portion are formed. The address latch portion receives, as an input, an address latch clock signal ALC, an address of a cell to be selected in the memory cell array portion, and a fixed address setting signal FAS for setting the fixed address corresponding to a cell to be specified in the memory cell array portion. The address latch portion generates the address of the cell to be selected between falling edges of the clock and generates the fixed address of the cell to be specified on both sides of the falling edge of the clock. The address decoder portion decodes the address SA and the address FA into a decoded address DSA and a decoded address DFA, respectively. The memory cell array portion 3 outputs data ds and data df stored in the decoded address DSA and the decoded address DFA, respectively. The output latch portion 5 latches only the data ds.

Further features and advantages of the present invention will be apparent from the ensuing description with reference to the accompanying drawings, to which, however, the scope of the invention is in no way limited.

BRIEF DESCRIPTION OF THE DRAWINGS

FIG. 5 is a circuit diagram of a modification of the apparatus of FIG. 3;

FIG. 6A is a diagram of the order of the method steps in the prior art; and

FIG. 6B is diagram of the order of the method steps in the present invention.

DESCRIPTION OF THE PREFERRED EMBODIMENTS

Figure 1:
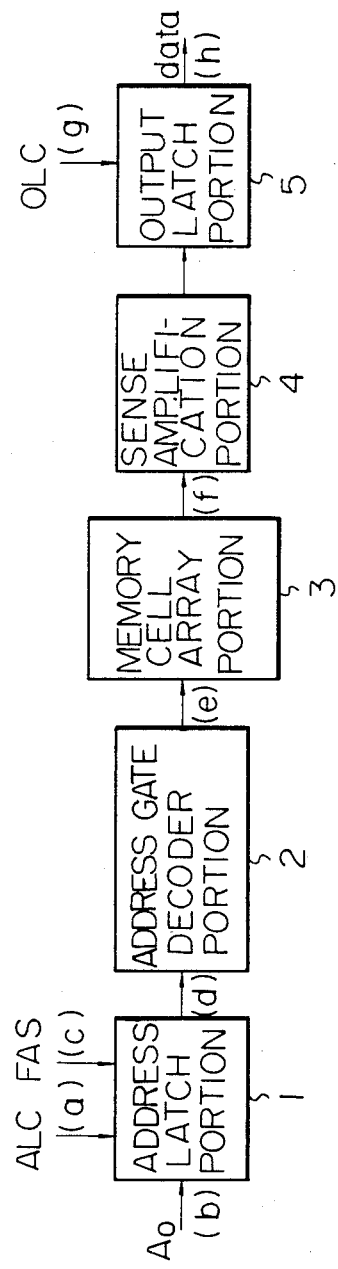
FIG. 1 is a block diagram for explaining the method and apparatus in accordance with the present invention.
Figure 2:
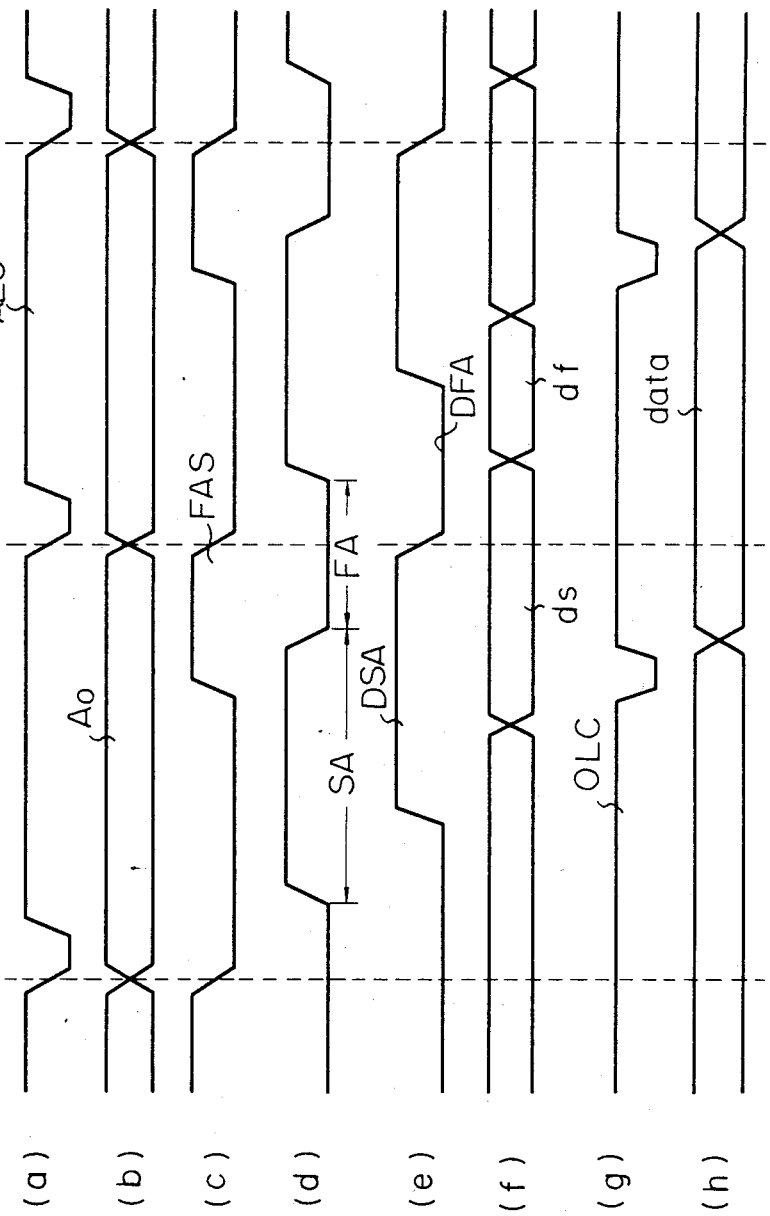
FIG. 2 is a timing chart of the block diagram of FIG. 1.

Referring to FIGS. 1 and 2, reference numeral 1 shows an address latch portion, 2 an address gate decoder portion, 3 a memory cell array portion, 4 a sense amplification portion, and 5 an output latch portion.

An address latch clock ALC, an address $A_0$ of a cell to be selected in the memory cell array portion, and a fixed address setting signal FAS for setting the fixed address corresponding to a cell to be specified in the memory cell array portion, are input to the address latch portion 1. The address latch portion 1 outputs an address SA of the cell to be selected and a fixed address FA of the cell to be specified.

The address gate decoder portion 2 decodes the selected cell address SA and specified cell address FA and sends decoded signals DSA and DFA to the memory cell array portion 3 (see (e) in FIGS. 1 and 2).

The memory cell array portion 3 reads out the data ds and df stored in the cells corresponding to the above decoded signals DSA and DFA. The sense amplification portion 4 amplifies the data ds and df.

The output latch portion 5 latches by an output latch clock OCL only the data ds stored in the selected cell and generates data as shown in FIG. 1($h$) or FIG. 2($h$).

The operation of each portion in FIG. 1 will be explained hereafter referring to FIGS. 3 and 4.

Figure 4:
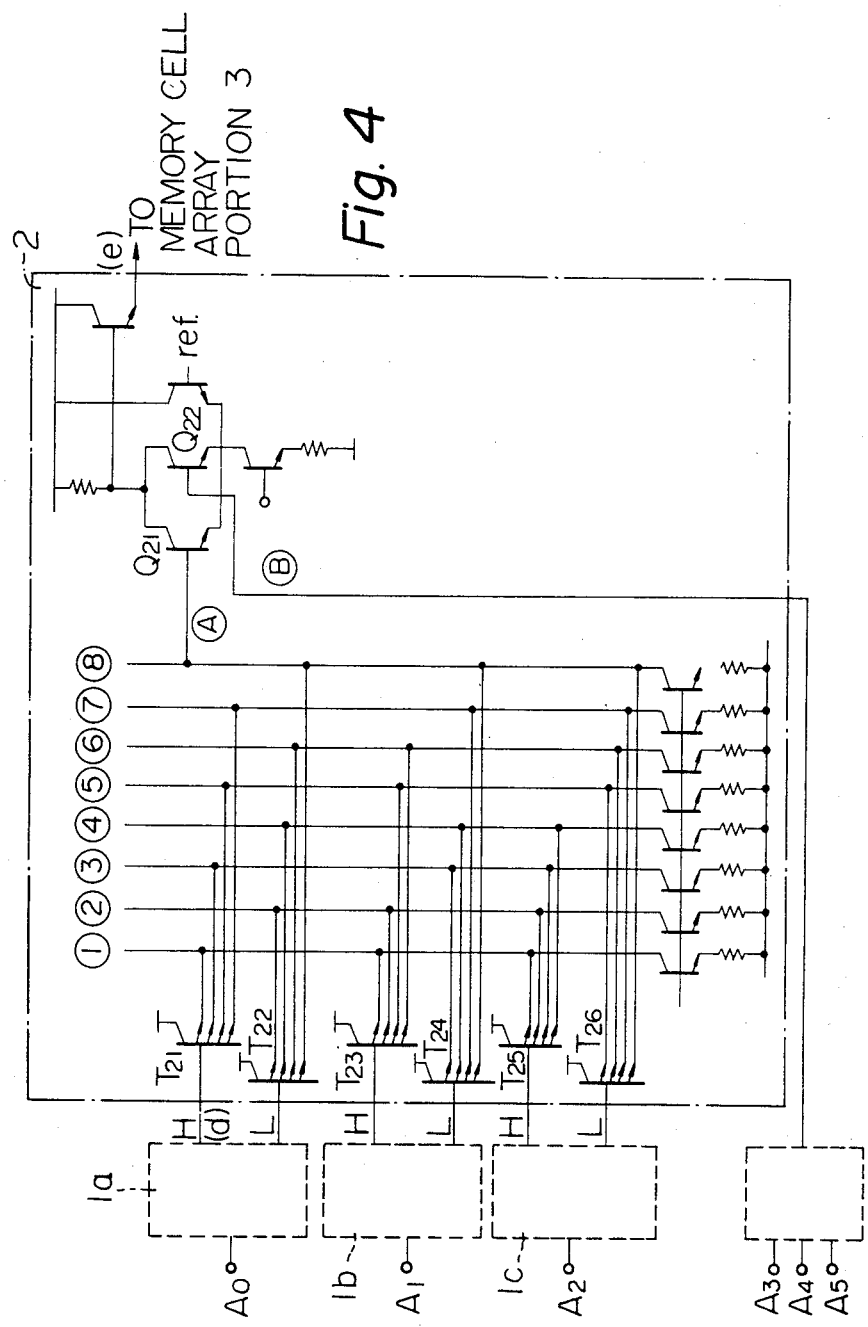
FIG. 4 is a circuit diagram of an address gate portion of the apparatus of FIG. 3.

The address latch portion 1 comprises three parts $1a$, $1b$, and $1c$, in which the addresses $A_0$, $A_1$, and $A_2$ are input respectively, as shown in FIG. 4. Since all the parts of the address latch portion 1 operate the same, only the operation of part $1a$ will be referred to.

While the address latch clock ALC is at the "H" level, the previous state is kept. Reference will be made to FIG. 3 where the "H" level ALC is applied to the base of a transistor $Q_{12}$. The base potential of a current switch $T_{11}$ is higher than that of a current switch $T_{12}$. Therefore, current switches $T_{11}$ turn on, but current switches $T_{12}$ turn off in an input gate circuit IG. Under these circumstances, when the address $A_0$ is applied, since the switch $T_{19}$ is off the lower terminal of a resistor $R_{11}$ is at the "H" level. Thus, the address SA is sent to the address gate decoder portion 2 from 1a as shown by (d) of FIG. 3 or in FIG. 2(d).

On the other hand, in spite of the application of the address $A_0$, when the fixed address setting signal FAS is input, since the switch $T_{15}$ is on, a current goes through a resistor $R_{12}$ to the switches $T_{15}$ and $T_{11}$. Therefore, as the lower terminal of the resistor $R_{12}$ turns to the "L" level and the lower terminal of the resistor $R_{11}$ turns to the "H" level, the fixed address FA is sent to the address gate decoder portion 2, as shown by (d) of FIG. 3 or in FIG. 2(d).

That is, for each falling edge of the clock ALC as shown in FIG. 2(a), the selected address $A_0$ and the fixed address setting signal FAS are applied to the part 1a, as shown in FIGS. 2(b) and (c). The above $A_0$ and FAS are latched as the output as shown in FIG. 2(d), whereby the address SA between one edge and the other edge of the clock ALC and the address FA on both sides of the falling edge of the clock ALC, appear sequentially, as shown in FIG. 2(d).

Details of the address gate decoder portion 2 are shown in FIG. 4. The two outputs of the part 1a are applied to the bases of multiemitter transistors $T_{21}$ and $T_{22}$ of the address gate decoder portion 2, respectively. Emitters of the transistors $T_{21}$ and $T_{22}$ are connected with lines ① to ⑧, respectively. The other parts 1b and 1c are the same as part 1a.

Each of the lines ① to ⑧ is clamped to the "H" level when an "H" level signal is applied to the line. In the case of the embodiment of FIG. 4, an "H" level signal is applied to at least one of the lines ① to ⑦ and an "L" level signal is applied to line ⑧. Thus, each of the lines ① to ⑦ is clamped to the "H" level and only line ⑧ is clamped to the "L" level. Line ⑧ is connected to the base of a transistor $Q_{21}$, and the other lines ① to ⑦ are connected, respectively, to bases of the same type of transistors as transistor $Q_{21}$, whose illustration is omitted to simplify FIG. 4. Eight signals formed by three addresses $A_0$, $A_1$ and $A_2$ are decoded through line Ⓐ by a known method.

With respect to part 1a, the decoded signals DSA and DFA are sent to the memory cell array portion 3 as shown in (e) of FIG. 4 and FIG. 2(e). If another three addresses $A_3$, $A_4$ and $A_5$ exist, these are decoded through another line Ⓑ in the same way as above.

Figure 3:
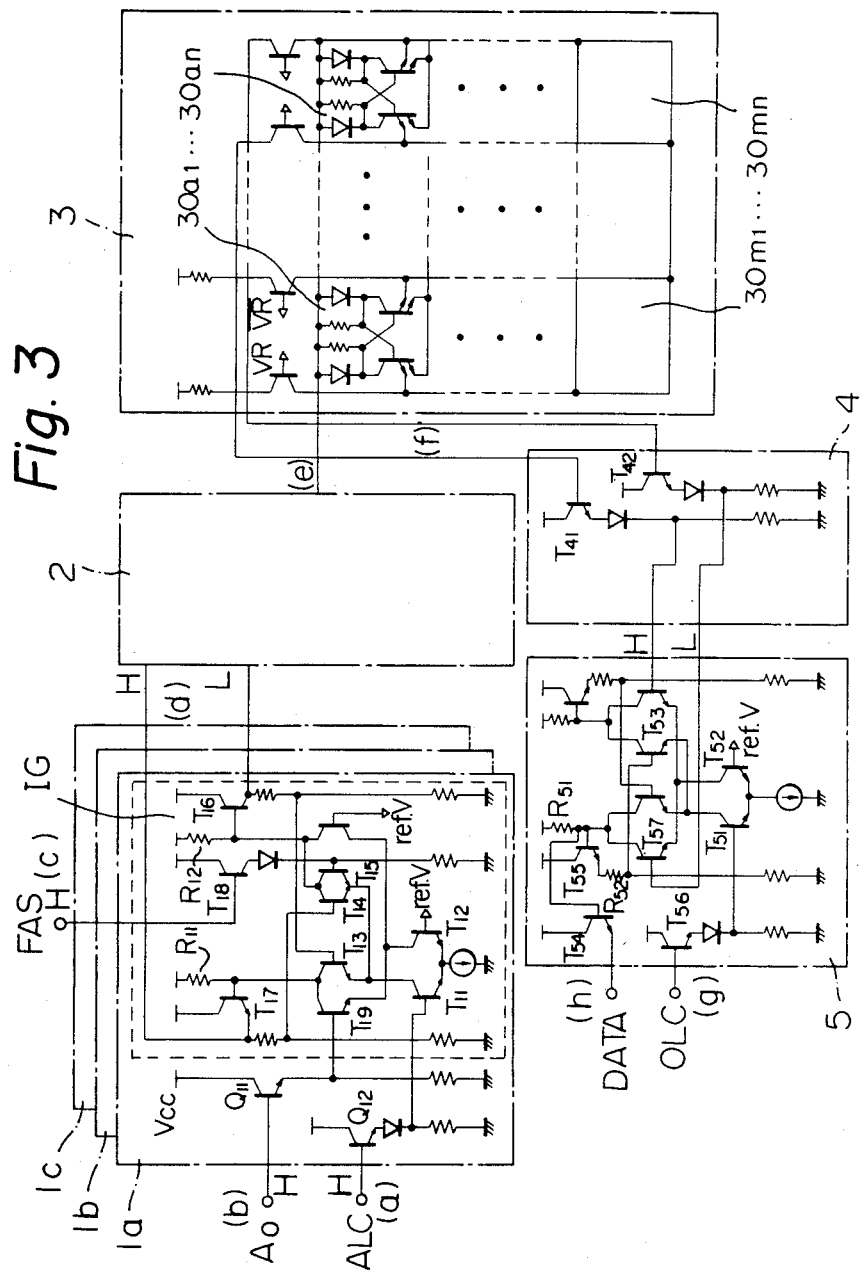
FIG. 3 is a circuit diagram of an apparatus based on FIG. 1.

Referring to FIG. 3, the memory cell array portion 3 comprises cells forming m columns and n rows.

The data ds and df stored in the cells corresponding to the input addresses DSA and DFA (see (e) of FIG. 3 and FIG. 2(e)) are read out as shown in (f) of FIG. 3 and FIG. 2(f). The data ds and df are amplified by transistors $T_{41}$ and $T_{42}$ of the sense amplification portion 4 and are sent to the output latch portion 5.

Usually an "H" level output latch clock OLC is applied to the base of a transistor $T_{56}$ in the output latch portion 5, as shown in (g) of FIG. 3 and FIG. 2(g). When the OLC becomes the "L" level, a current switch $T_{51}$ turns off, but another current switch $T_{52}$ turns on. As an "H" level signal is applied to the base of a transistor $T_{53}$, an "L" level signal is applied to the base of a transistor $T_{57}$, and the transistor $T_{57}$ turns off and the lower terminal of a resistor $R_{51}$ becomes the "H" level. The result is that the amplified "H" level data ds is output through an output transistor $T_{54}$, as shown in (h) of FIG. 3 and FIG. 2(h). In this manner, the function of the OCL enables the output latch portion 5 to latch not the data df, but the data ds stored in the memory cell array portion 3.

FIG. 5 refers to a modification of the embodiment of the invention. After the address $A_0$ is input, the fixed address is sent to an input gate circuit IG by turning the fixed address setting signal F to an "H" level. The operation thereafter is the same as that of part 1a in FIG. 3 and will therefore be deleted.

The effect of the invention will be explained hereafter based on FIG. 6B, compared with the effect of the prior art as shown in FIG. 6A.

According to the prior art, cells a, b, c, d and e are alternatively selected as shown by arrows ①, ②, ③ and ④ or as shown by arrows ①, ②', ②", ③ and ④. But in accordance with the present invention, after the cell a is selected, the specified cell FC having the fixed address is selected (see arrow ①), after the cell FC, the cell b is selected (see arrow ②) and the cell FC is selected again (see arrow ②'). In this way, the specified cell FC is always selected between the cells a and b, b and c, c and d and d and e.

Therefore, according to the invention, as the cells a, b, c, d and e are always selected through the specified cell FC. Therefore, the dependence of the working characteristics of the memory device on the selection pattern of the memory cells is reduced. Moreover, since all the selection patterns are tested by accessing all the cells during each access, the efficiency of the test of the memory device is improved.

We claim:

1. An apparatus for controlling the readout or write-in of data of a semiconductor memory device, operatively connected to receive an address latch clock signal and a fixed address setting signal, and including a memory cell array portion having memory cells having addresses, said apparatus comprising:

an address latch portion operatively connected to the memory cell array portion and operatively connected to receive the address latch clock signal, a selected address of a memory cell to be selected in the memory cell array portion and the fixed address setting signal, for inputting a fixed address designated by the fixed address setting signal, corresponding to the memory cell to be selected in the memory cell array portion and sequentially outputting the selected address and the fixed address, following the address latch clock signal;

an address decoder portion, operatively connected to said address latch portion, for decoding the selected address and the fixed address into a decoded selected address and a decoded fixed address, respectively, the memory cell array portion comprising means for outputting data corresponding to the decoded selected address and the decoded fixed address, respectively; and an output latch portion, operatively connected to the memory cell array portion, for latching only data corresponding to the decoded selected address.

2. An apparatus for controlling the read-out or write-in of data in a semiconductor memory device, operatively connected to receive an address latch clock signal, a memory cell address, a fixed address setting signal and an output latch clock signal, comprising:

an address latch portion, operatively connected to receive the address latch clock signal, the memory cell address and the fixed address setting signal, for sequentially generating the memory cell address and a fixed address, in accordance with the fixed address setting signal, following the address latch clock signal;

an address gate decoder portion, operatively connected to said address latch portion, for receiving and decoding the memory cell address and the fixed address into a decoded memory cell address and a decoded fixed address, respectively;

a memory cell array portion including memory cells having addresses, operatively connected to said address gate decoder portion, for receiving the decoded memory cell address and the decoded fixed address and for outputting data corresponding to the decoded memory cell address and the decoded fixed address, respectively; and an output latch portion, operatively connected to said memory cell array portion, for receiving the data corresponding to the decoded memory cell address and the decoded fixed address and latching only the data corresponding to the decoded memory cell address in response to the output latch clock signal.

3. A method for controlling the readout or write-in of data of a semiconductor memory device including a memory cell array having memory cells, the semiconductor memory device operatively connected to receive external address signals, a fixed address setting signal and a clock signal having a rising edge and a falling edge, comprising the steps of:

inputting the fixed address setting signal, corresponding to a memory cell to be selected, into the memory cell array;

generating, on both sides of the falling edge of the clock signal, the address of a memory cell to be selected;

decoding the address of the memory cell to be selected and the fixed address into a decoded selected address and a decoded fixed address, respectively;

outputting data from the memory cell array corresponding to the decoded selected address and the fixed decoded address; and latching the data corresponding to the decoded selected address.

4. A semiconductor memory device operatively connected to receive external address signals and having a fixed address signal, comprising:

memory cell array having a plurality of memory cells; and memory access means, operatively connected to said memory cell array, for receiving a selected address signal in dependence upon the external address signals, for accessing one of said memory cells selected in accordance with the selected address signal, and for accessing one of said memory cells, having an address corresponding to the fixed address signal, following the access of said selected memory cell, said memory access means accessing said selected memory cell and said memory cell designated by the fixed address signal during a single address cycle.

* * * * *